(12) United States Patent
Lee

(10) Patent No.: US 11,927,994 B2
(45) Date of Patent: Mar. 12, 2024

(54) PIVOT MECHANISM AND ELECTRONIC DEVICE APPLYING THE SAME

(71) Applicant: GETAC HOLDINGS CORPORATION, Taoyuan (TW)

(72) Inventor: Kun-Cheng Lee, Taipei (TW)

(73) Assignee: Getac Holdings Corporation, Taoyuan (TW)

( * ) Notice: Subject to any disclaimer, the term of this patent is extended or adjusted under 35 U.S.C. 154(b) by 308 days.

(21) Appl. No.: 17/024,450

(22) Filed: Sep. 17, 2020

(65) Prior Publication Data

US 2021/0089090 A1 Mar. 25, 2021

Related U.S. Application Data

(60) Provisional application No. 62/904,967, filed on Sep. 24, 2019.

(51) Int. Cl.
| | |
|---|---|
| *G06F 1/16* | (2006.01) |
| *E05D 3/02* | (2006.01) |
| *E05D 5/04* | (2006.01) |
| *F16C 11/04* | (2006.01) |
| *H01Q 1/22* | (2006.01) |
| *H05K 5/00* | (2006.01) |
| *H05K 5/02* | (2006.01) |

(Continued)

(52) U.S. Cl.
CPC ............ *G06F 1/1698* (2013.01); *E05D 3/02* (2013.01); *E05D 5/04* (2013.01); *F16C 11/04* (2013.01); *G06F 1/1654* (2013.01); *G06F 1/1683* (2013.01); *H01Q 1/2266* (2013.01); *E05Y 2900/606* (2013.01); *G06F 1/1616* (2013.01); *G06F 1/1656* (2013.01); *G06F 1/1679* (2013.01); *H05K 5/0017* (2013.01); *H05K 5/0204* (2013.01); *H05K 5/04* (2013.01); *H05K 5/061* (2013.01); *H05K 5/069* (2013.01)

(58) Field of Classification Search
None
See application file for complete search history.

(56) References Cited

U.S. PATENT DOCUMENTS

| | | | |
|---|---|---|---|
| 2005/0115025 A1* | 6/2005 | Minaguchi | ............ G06F 1/1681 16/259 |
| 2008/0120808 A1* | 5/2008 | Wang | .................... G06F 1/1616 16/332 |

(Continued)

*Primary Examiner* — James Wu
*Assistant Examiner* — Christopher L Augustin
(74) *Attorney, Agent, or Firm* — Cooper Legal Group, LLC

(57) ABSTRACT

The present invention discloses a pivot mechanism and an electronic device applying the same. The electronic device includes a first body and a second body that are individually independent. The pivot mechanism is configured to turn the second body relative to the first body so that the second body may be in an open position or a closed position. The pivot mechanism includes a base and a pivot structure. The base includes a first connecting member and a second connecting member, which are fixedly connected on a top portion and a peripheral portion of the first body, respectively. Extension directions of the first second connecting members are perpendicular to each other. The pivot structure is disposed on the first connecting member, and is fixedly connected to the second body. Accordingly, stable joining of the first second bodies is ensured, and turning stability and smoothness are at the same time satisfied.

17 Claims, 7 Drawing Sheets

(51) Int. Cl.
*H05K 5/04* (2006.01)
*H05K 5/06* (2006.01)

(56) References Cited

U.S. PATENT DOCUMENTS

| | | | |
|---|---|---|---|
| 2009/0083943 A1* | 4/2009 | Chen | G06F 1/1681 |
| | | | 16/342 |
| 2017/0370136 A1* | 12/2017 | Huang | G06F 1/1681 |
| 2018/0059737 A1* | 3/2018 | Wu | G06F 1/1681 |
| 2019/0094918 A1* | 3/2019 | Lin | G06F 1/1681 |

* cited by examiner

PIVOT MECHANISM AND ELECTRONIC DEVICE APPLYING THE SAME

CROSS-REFERENCE TO RELATED APPLICATIONS

The present application claims the benefit of U.S. provisional Patent Application No. 62/904,967, filed on Sep. 24, 2019, the disclosure of which is hereby incorporated by reference herein in its entirety.

BACKGROUND OF THE INVENTION

Field of the Invention

The present invention relates to a pivot mechanism, and more particularly to a pivot mechanism providing an electronic device with a turning function, and an electronic device applying the same.

Description of the Prior Art

Laptop computers feature advantages of being light, thin and small in size, in addition to providing functions of common desktop computers, and have therefore become portable indispensables for certain users. Moreover, as prices of laptop computers continue to drop, the number of users using laptop computers as substitution for desktop computers also continues to increase.

A laptop computer primarily consists of a host and a screen, and usually has a pivot structure so as to implement a screen flip function, thereby providing more diversified applications. For example, a user may adjust a screen by the pivot mechanism to a position at which the screen can be viewed with ease. However, a base of a current pivot mechanism is generally designed as being mounted in an operation direction of a host (a top direction of the host), and so the base is likely to sway when the screen receiving an external force turns relative to the host, leading unstable turning of the screen. Furthermore, the base is also susceptible to issues of loosening and damage of mechanisms of the base due to an excessive external force applied on the screen, resulting in malfunction of the laptop computer.

SUMMARY OF THE INVENTION

The technical problem to be solved by the present invention is how to provide a pivot mechanism with respect to drawbacks of the prior art so as to enhance structural strength and reliability of an electronic device, and to further provide an electronic device applying the pivot mechanism.

To solve the foregoing technical problem, a pivot mechanism is provided according to a technical solution of the present invention. The pivot mechanism is suitable for an electronic device, which includes a first body and a second body. The pivot mechanism includes a base and a pivot structure. The base includes a first connecting member and a second connecting member, wherein extension directions of the first connecting member and the second connecting member are perpendicular to each other, and the first connecting member and the second connecting member are configured to connect to a top portion and a peripheral portion of the first body, respectively. The pivot structure is disposed on the first connecting member, and is configured to turn the second body relative to the first body.

Further, the first connecting member includes a main connecting portion, a secondary connecting portion, and a support arm connected between the main connecting portion and the secondary connecting portion, and extension directions of the main connecting portion and the secondary connecting portion are perpendicular to an extension direction of the support arm. The second connecting member is connected to the main connecting portion, and the pivot structure is pivotally provided on the support arm.

Further, each of the main connecting portion and the secondary connecting portion of the first connecting member has at least one locking hole, and the second connecting member has a plurality of positioning holes.

Further, the pivot structure includes a pivot portion and a holding portion connected to the pivot portion. The pivot portion is pivotally connected to the support arm, and the holding portion is configured to connect to the second body.

Further, the holding portion is a sheet structure, and includes a reinforcing rib extending along an external peripheral outline thereof.

Further, the holding portion has at least one locking hole.

To solve the foregoing technical problem, an electronic device is provided according to another technical solution of the present invention. The electronic device includes a first body, a pivot mechanism and a second body. The first body includes a top portion and a peripheral portion. The pivot mechanism includes a base and a pivot structure. The base includes a first connecting member and a second connecting member, wherein extension directions of the first connecting member and the second connecting member are perpendicular to each other, and the first connecting member and the second connecting member are fixedly connected on the top portion and the peripheral portion of the first body, respectively. The pivot structure is disposed on the first connecting member. The second body is fixedly connected to the pivot structure, so as to turn relative to the first body and to be at an open position or a closed position.

Further, the first connecting member includes a main connecting portion, a secondary connecting portion, and a support arm connected between the main connecting portion and the secondary connecting portion, and extension directions of the main connecting portion and the secondary connecting portion are perpendicular to an extension direction of the support arm. The second connecting member is connected to the main connecting portion, and the pivot structure is pivotally provided on the support arm.

Further, each of the main connecting portion and the secondary connecting portion of the first connecting member has at least one locking hole, and the second connecting member has a plurality of positioning holes.

Further, the pivot structure includes a pivot portion and a holding portion connected to the pivot portion. The pivot portion is pivotally connected to the support arm, and the holding portion is configured to connect to the second body.

Further, the holding portion is a sheet structure, and includes a reinforcing rib extending along an external peripheral outline thereof.

Further, the holding portion has at least one locking hole.

One benefit of the present invention is that, by the technical solution that is "the first connecting member and the second connecting member of the base have the extension directions perpendicular to each other, and are respectively connected to the top portion and the peripheral portion of the first body, and the pivot structure is disposed on the first connecting member and is configured to turn the second body relative to the first body", the pivot mechanism of the present invention provides the first body and the second body of an electronic device with improved joining strength, and enhances stability and smoothness of mutual relative turning between the two.

To better understand the features and technical contents of the present invention, detailed description and drawings of the present invention are further given below. However, it should be noted that the provided drawings are for reference and illustration purposes, and are not to be construed as limitations to the present invention.

DETAILED DESCRIPTION OF THE EMBODIMENTS

Specific embodiments are given below to describe implementations of "an electronic device and a pivot mechanism" disclosed by the present invention for a person skilled in the art to understand the advantages and effects of the present invention from the disclosed contents in the detailed description of the application. The present invention may be implemented or applied in forms of other specific embodiments, and various details of in the detailed description of the application may also be modified and altered on the basis of different aspects and applications without departing from the concept of the present invention. Further, it should be noted that the accompanying drawings of the present invention are simple schematics that are not drawn to actual sizes. Details of the embodiments are given to further describe the related technical contents of the present invention; however, the disclosed contents are not to be construed as limitations to the scope of protection of the present invention. In addition, the term "or" used in the disclosure may include any one or multiple combinations of the related enumerated items.

Figure 1:
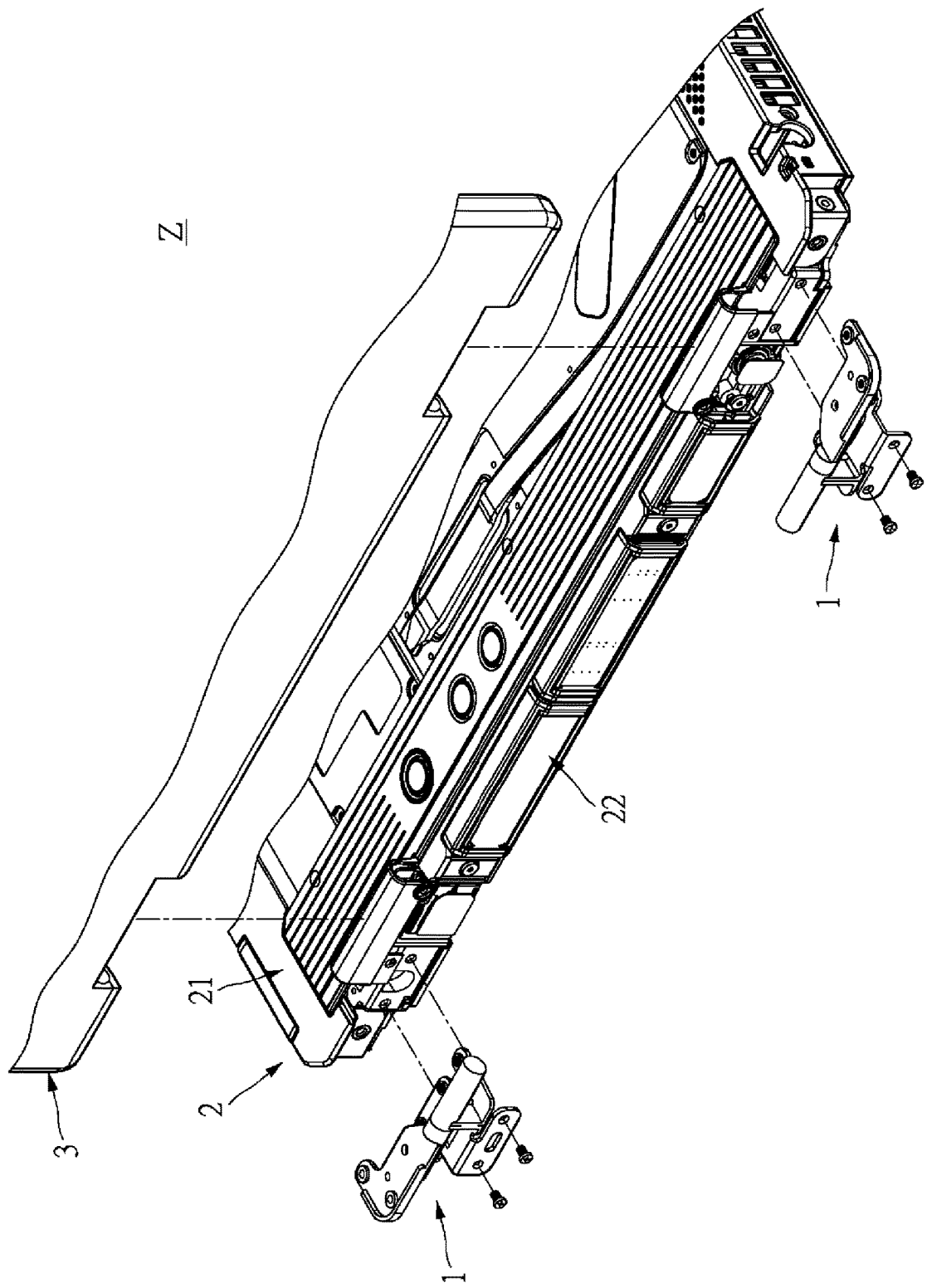
FIG. 1 is a partial exploded three-dimensional schematic diagram of an electronic device of the present invention.
Figure 2:
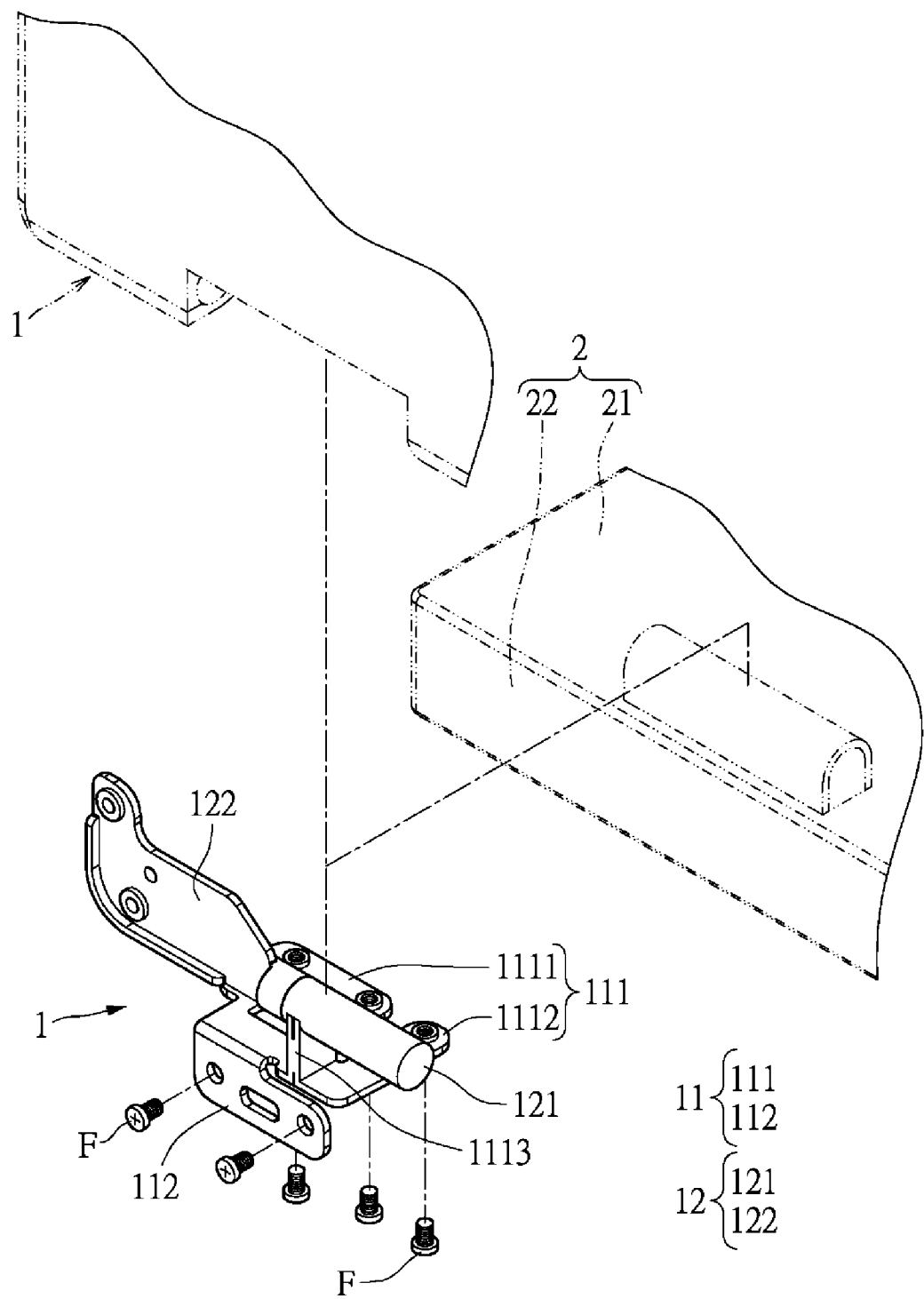
FIG. 2 is another partial exploded three-dimensional schematic diagram of an electronic device of the present invention.
Figure 3:
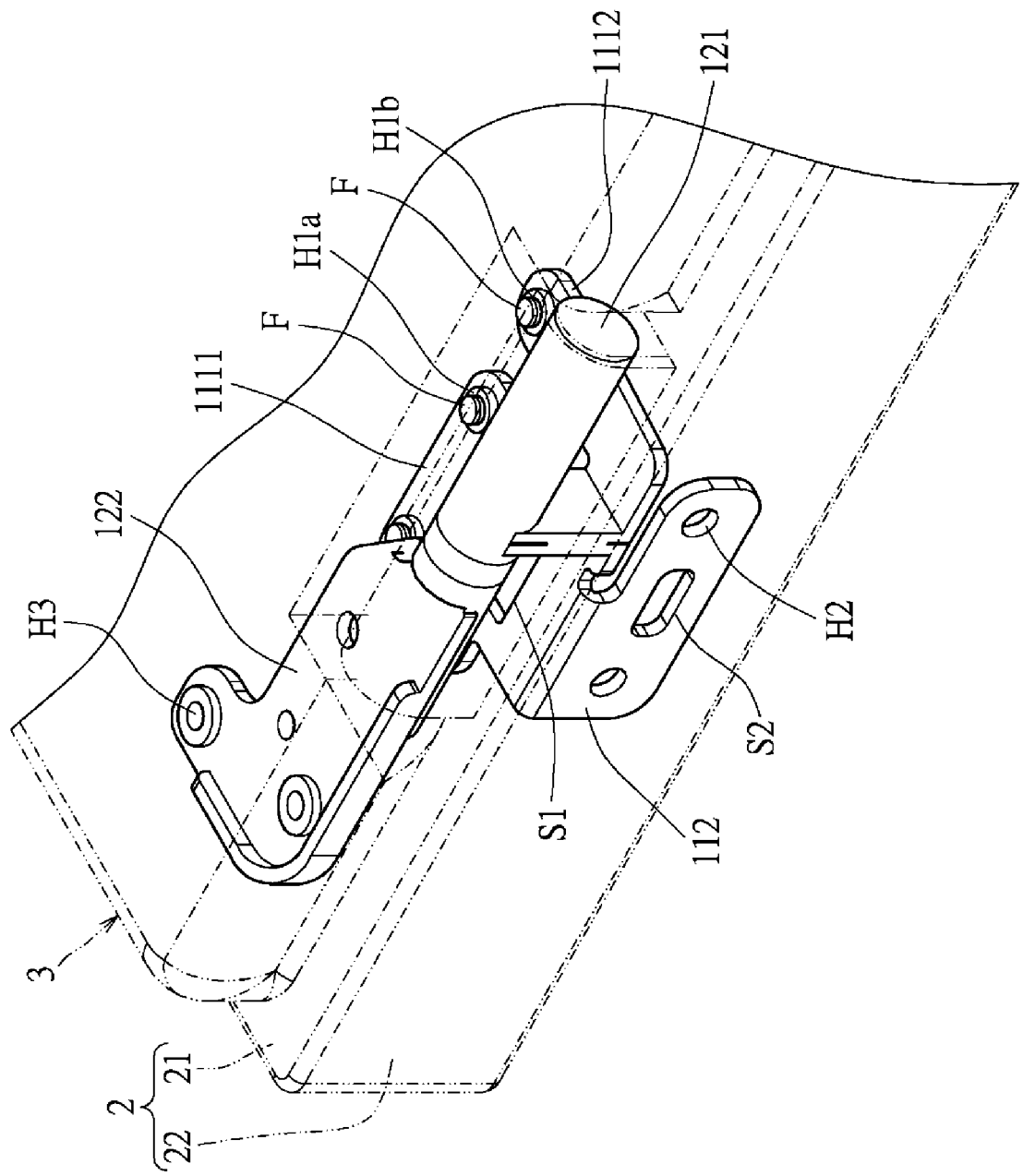
FIG. 3 is a schematic diagram of a state of use of an electronic device of the present invention.
Figure 4:
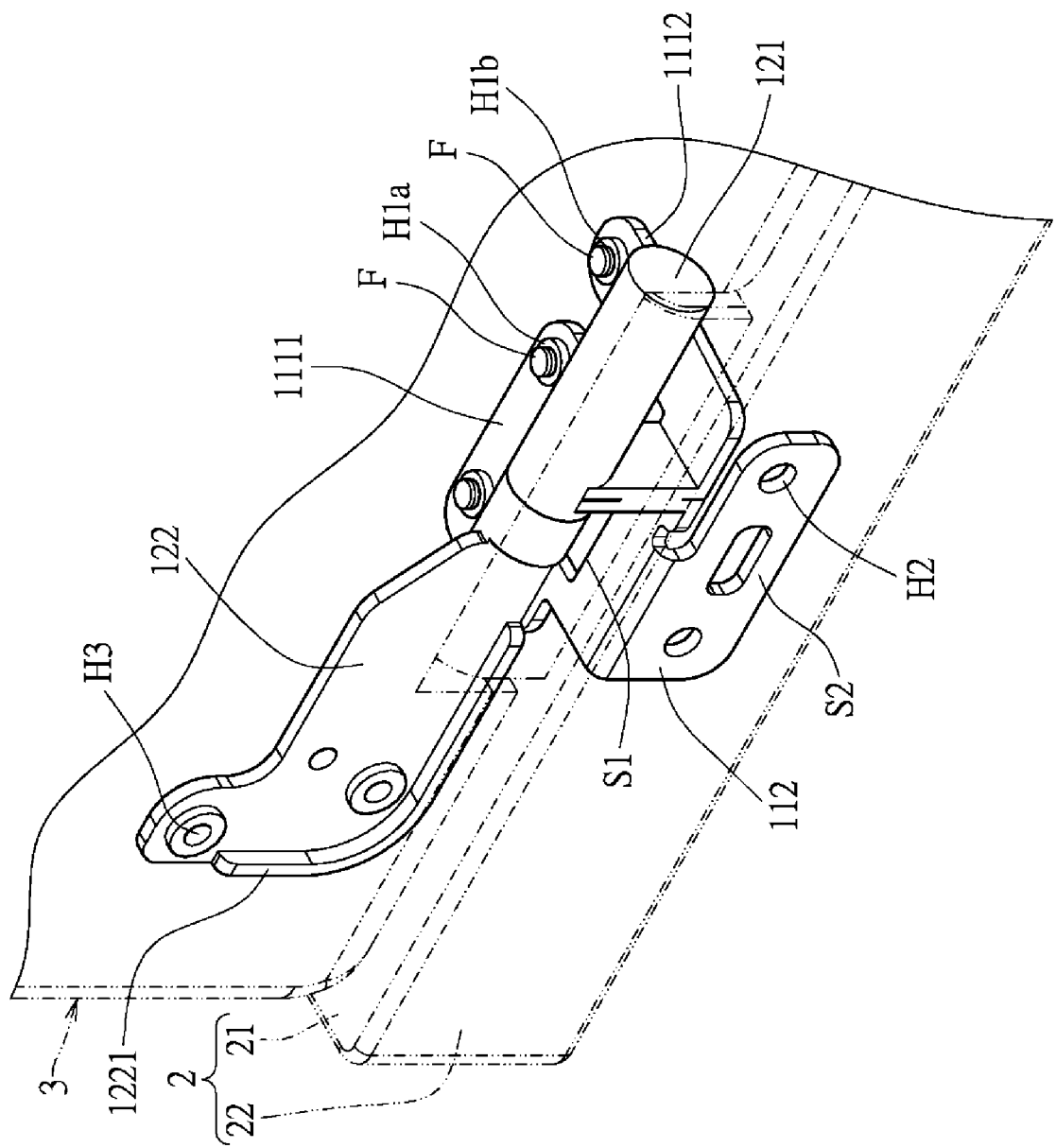
FIG. 4 is another schematic diagram of a state of use of an electronic device of the present invention.

Referring to FIG. 1 to FIG. 4, an electronic device Z provided according to a preferred embodiment of the present invention primarily includes at least one pivot mechanism 1, a first body 2 and a second body 3. The at least one pivot mechanism 1 is configured to stably join the first body 2 and the second body 3 into one body, and allows the first body 2 and the second body 3 to mutually turn relative to each other. Although the electronic device Z is depicted as including two pivot mechanisms 1 configured on positions of nearby corners of the first body 2, it may include only one pivot mechanism 1 configured on a middle position of the first body 2. In this embodiment, the electronic device Z is a laptop computer; the first body 2 includes a processing unit and a plurality of electronic components so as to perform functions of a computer device; and the second body 3 includes a display screen and may be in an open position as shown in FIG. 3, so as to perform dynamic or still image display, or be in a closed position as shown in FIG. 4. However, the present invention is not limited to the above exemplary applications.

Figure 5:
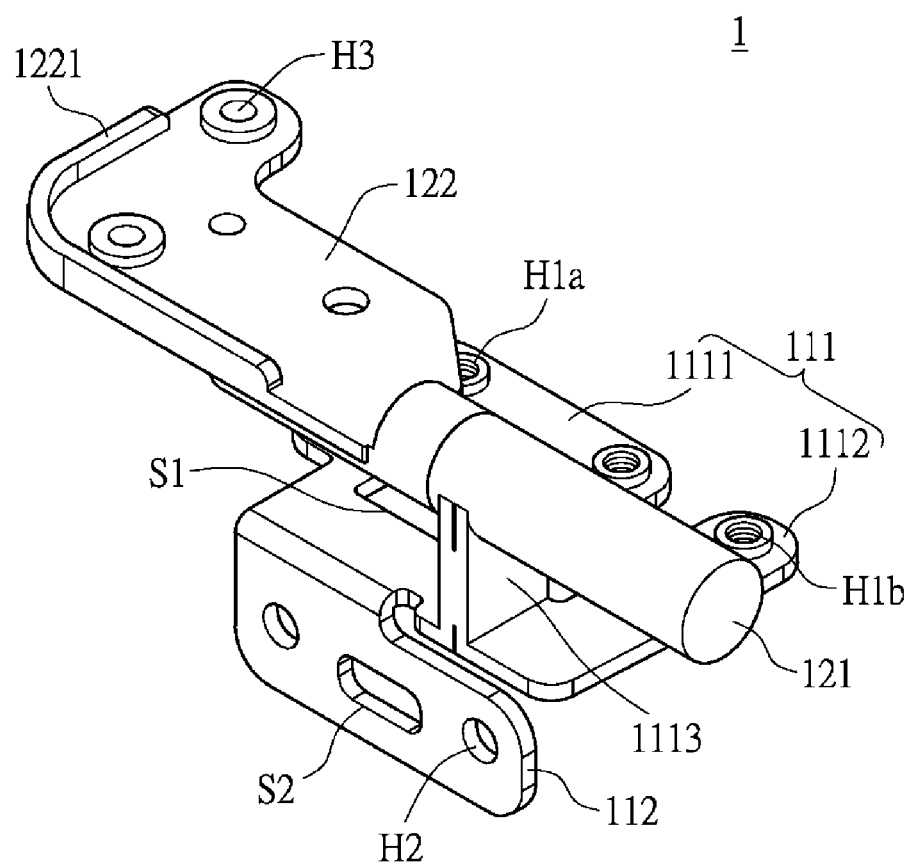
FIG. 5 is a three-dimensional schematic diagram of a pivot mechanism of the present invention.
Figure 6:
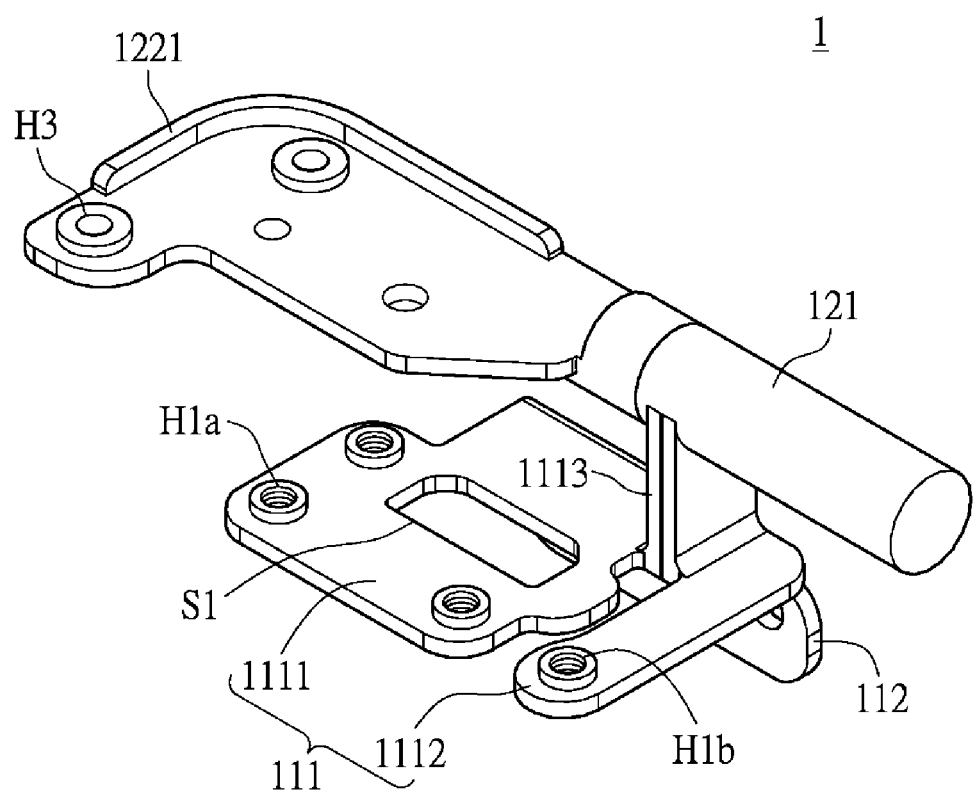
FIG. 6 is another three-dimensional schematic diagram of a pivot mechanism of the present invention.

Referring to FIG. 5 and FIG. 6, the composition of the pivot mechanism 1 includes a base 11 and a pivot structure 12. The base 11 includes a first connecting member 111 and a second connecting member 112. The first connecting member 111 and the second connecting member 112 have extension directions perpendicular to each other, and are connected to a top portion 21 and a peripheral portion 22 of the first body 2, respectively. Although the first connecting member 111 and the second connecting member 112 are exemplified as being fixedly connected to a top wall and a rear sidewall of the first body 2, respectively, the present invention is not limited thereto. Further, the pivot structure 12 is disposed on the first connecting member 111 and is connected to the second body 3, so as to drive and turn the second body 3 relative to the first body 2 to a position. It should be noted that, the base 11 is capable of distributing stress to the top portion 21 and the peripheral portion 22 of the first body 2 in the process of turning the second body 3 in addition to increasing the joining strength of the first body 2 and the second body 3, so as to enhance stability and smoothness of turning.

Further, the first connecting member 111 includes a main connecting portion 1111, a secondary connecting portion 1112 and a support arm 1113. The support arm 1113 is connected between the main connecting portion 1111 and the secondary connecting portion 1112. The main connecting portion 1111 and the secondary connecting portion 1112 are substantially located on the same plane, and the two form a sheet structure, wherein dimensions of the main connecting portion 1111 may be greater than dimensions of the secondary connecting portion 1112. The support arm 1113 extends upwards from the plane where the main connecting portion 1111 and the secondary connecting portion 1112 are located, that is, an extension direction of the support arm 113 is substantially perpendicular to extension directions of the main connecting portion 1111 and the secondary connecting portion 1112, so as to support the pivot structure 12.

In practice, each of the main connecting portion 1111 and the secondary connecting portion 1112 of the first connecting member 111 may have one or more locking holes H1a and H1b with threads, and may be respectively fixedly connected on the top portion 21 of the first body 2 by at least one locking member F (e.g., a screw) with a thread. In this embodiment, as shown in FIG. 2 and FIG. 4, the plurality of locking members F are lockingly attached in an outward manner to the main connecting portion 1111 and the secondary connecting portion 1112, that is, the plurality of locking members F first pass through the top portion 21 of the first body 2 and are then locked into the locking holes H1a and H1b of the main connecting portion 1111 and the secondary connecting portion 1112. According to actual requirements, the main connecting portion 1111 may further include a slot S1 for receiving and organizing connecting wires (not shown) needed by the second body 3. The slot S1 and the locking hold H1a are separately disposed, for example, the slot S1 is provided in a central region of the main connecting portion 1111 and the locking hole H1a is provided in a peripheral region of the main connecting portion 1111. However, the above contents are merely for describing feasible implementations of the first connecting member 111, and are not to be construed as a limitation to the present invention.

The second connecting member 112 is connected to the main connecting portion 1111 of the first connecting member 111, and is specifically a sheet structure formed as extending from one side of the main connecting portion 1111 of the first connecting member 111. In this embodiment, the second connecting member 112 has at least one smooth (without any thread) positioning hole H2, which allows the locking member F to be first passed through and then joined to the peripheral portion 22 of the first body 2 instead of tightly packing the locking member F, so as to achieve an effect of lockingly attaching the second connecting member 112. According to actual requirements, the second connecting member 112 may further include a slot S2 allowing passing of external components to function on the first body 2. The slot S2 and the positioning hole H2 are separately disposed, for example, the slot S2 is provided in a central region of the second connecting member 112, and the positioning hole H2 is provided in a peripheral region of the second connecting member 112. However, the above contents are merely for describing feasible implementations of the second connecting member 112, and are not to be construed as a limitation to the present invention.

The pivot structure 12 includes a pivot portion 121 and a holding portion 122 connected to the pivot portion 121. The pivot portion 121 is pivotally connected to the support arm 1113, and the holding portion 122 is connected to the second body 3. Thus, the pivot portion 121 may pivotally turn relative to the support arm 1113, and drive the second body 3 by the holding portion 122 to turn relative to the first body 2. In this embodiment, the holding portion 122 is a sheet structure formed as extending from one end of the pivot portion 121, has a position corresponding to a corner region of the second body 3 (e.g., a corner region of a frame of the body), and has at least one locking hole H3 with a thread. Thus, the holding portion 122 may be connected with the second body 3 into one body by at least one locking member with a thread (e.g., a screw, not shown). To improve mechanical strength, the holding portion 122 may have a reinforcing rib 1221 extending along an outer peripheral outline. However, the above contents are merely for describing feasible implementations of the pivot structure 12, and are not to be construed as a limitation to the present invention.

Figure 7:
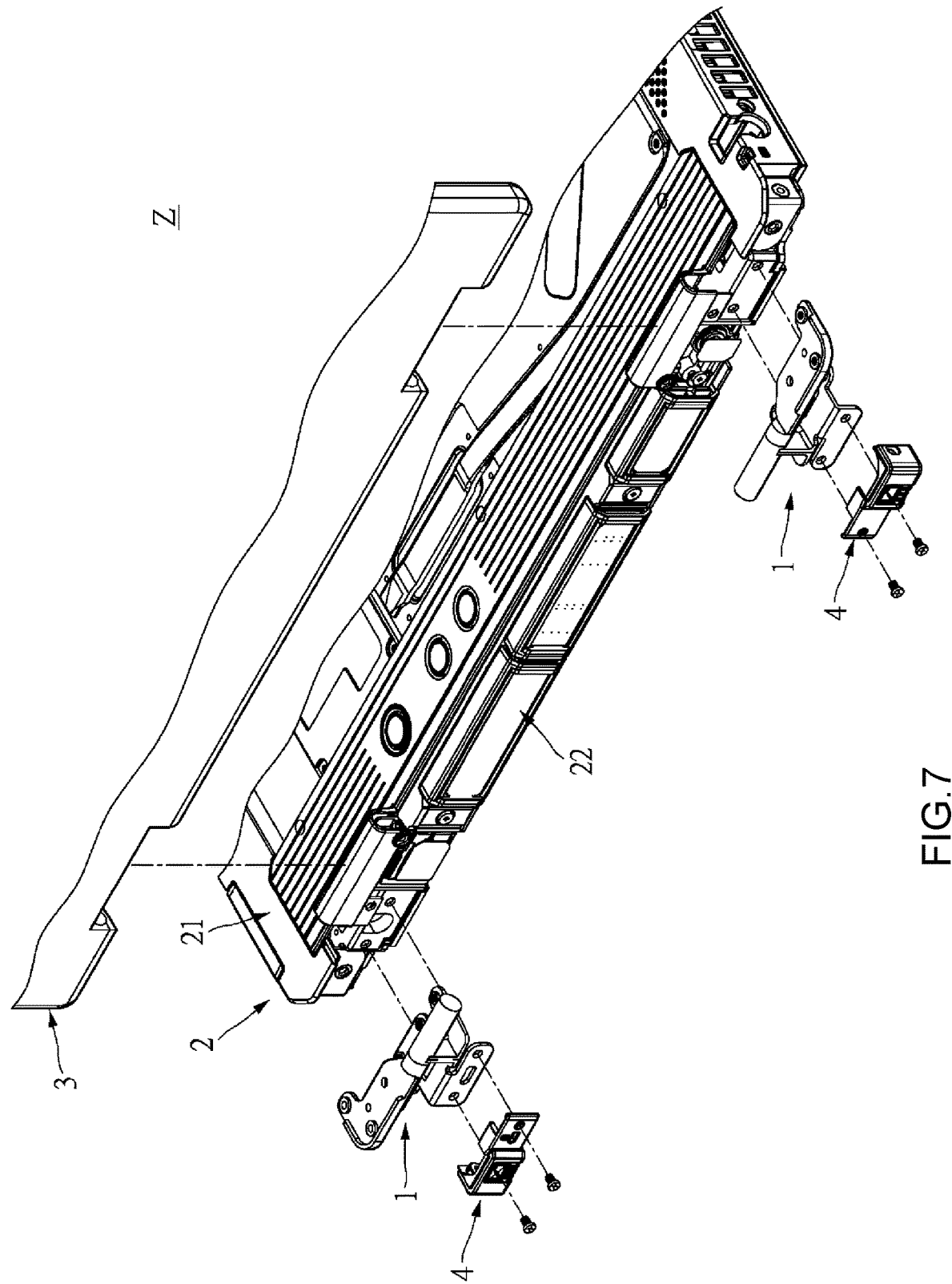
FIG. 7 is another partial exploded three-dimensional schematic diagram of an electronic device of the present invention.

Referring to FIG. 7, the electronic device Z of the present invention may further include at least one protective cover 4. The protective cover 4 not only provides the pivot mechanism 1 with sufficient buffering and protection, but also enhances anti-collision strength of the electronic device Z that then accordingly satisfies "military standards". In this embodiment, the number of the protective cover 4 may be equal to the number of the pivot mechanism 1. The protective cover 4 may be joined to the peripheral portion 22 of the first body 2, and cover an outer side of the second connecting member 112 of the pivot mechanism 1, wherein the positioning hole H2 and the slot S2 of the second connecting member 112 are exposed from the protective cover 4 so as to perform required functions. In practice, the protective cover 4 and the pivot mechanism 1 corresponding to the protective cover 4 may be together locked on the peripheral portion 22 of the first body 2.

[Benefits of the Embodiments]

One benefit provided by the present invention is that, by the technical solution that is "the first connecting member and the second connecting member of the base have the extension directions perpendicular to each other, and are respectively connected to the top portion and the peripheral portion of the first body, and the pivot structure is disposed on the first connecting member and is configured to turn the second body relative to the first body", the pivot mechanism of the present invention provides the first body and the second body of an electronic device with improved joining strength, and enhances stability and smoothness of mutual relative turning between the two.

Further, during the process of turning of the first body and/or the second body of the electronic device, the base of the pivot mechanism may distribute stress to the top portion and the peripheral portion of the first body, hence providing better reliability and capability of functioning normally for an extended period of time.

The contents disclosed above are merely preferred feasible embodiments of the present invention and are not to be construed as limitations to the scope of claims of the present invention. All equivalent technical changes made on the basis of the contents given in the detailed description and drawings of the application are to be encompassed within the scope of the appended claims.

What is claimed is:

1. An electronic device, comprising:
   a first body, comprising a top portion and a peripheral portion;
   a pivot mechanism, comprising a base and a pivot structure, the base comprising a first connecting member and a second connecting member, wherein extension directions of the first connecting member and the second connecting member are perpendicular to each other, the first connecting member and the second connecting member are fixedly connected on the top portion and an exterior surface of the peripheral portion of the first body, respectively, and the pivot structure is disposed on the first connecting member; and
   a second body, fixedly connected to the pivot structure, so as to turn relative to the first body and hence be in an open position or a closed position;
   wherein first portions of the first connecting member and the second connecting member are respectively connected, and a gap is formed between respective second portions of the first connecting member and the second connecting member, the gap corresponding to an intersection of the top portion and the peripheral portion of the first body; and
   wherein a longest dimension of the second portion of the first connecting member and a longest dimension of the second portion of the second connecting member extend in a same direction.

2. The electronic device according to claim 1, wherein the first connecting member comprises a main connecting portion, a secondary connecting portion, and a support arm connected between the main connecting portion and the secondary connecting portion, extension directions of the main connecting portion and the secondary connecting portion are perpendicular to an extension direction of the support arm, the second connecting member is connected to the main connecting portion, and the pivot structure is pivotally connected on the support arm.

3. The electronic device according to claim 2, wherein the pivot structure comprises a pivot portion and a holding portion connected to the pivot portion, the pivot portion is pivotally connected to the support arm, and the holding portion is configured to connect to the second body.

4. The electronic device according to claim 2, wherein each of the main connecting portion and the secondary connecting portion of the first connecting member has at least one locking hole, and the second connecting member has a plurality of positioning holes.

5. The electronic device according to claim 4, wherein the pivot mechanism further comprises a plurality of first locking members and a plurality of second locking members, the at least one locking hole is a plurality of locking holes, the plurality of first locking members pass through the top portion of the first body in a first locking direction so as to be respectively locked into the plurality of locking holes, and the plurality of second locking members respectively pass through the plurality of positioning holes in a second locking direction so as to be locked into the peripheral portion of the first body, the first locking direction is a direction in which the top portion of the first body approaches the first connecting member, and the second locking direction is a direction in which the second connecting member approaches the peripheral portion of the first body.

6. The electronic device according to claim 3, wherein the holding portion is a sheet structure and comprises a reinforcing rib extending along an external peripheral outline of the holding portion.

7. The electronic device according to claim 6, wherein the holding portion has at least one locking hole.

8. The electronic device according to claim 1, wherein the gap is a substantially u-shaped gap.

9. The electronic device according to claim 1, wherein the first connecting member and the second connecting member are equal in width as measured in a direction parallel to an axial direction of the pivot structure.

10. The electronic device of claim 1, wherein the second connecting member defines an elongated slot and a positioning hole.

11. The electronic device of claim 1, wherein the gap is defined by a sidewall of the second portion of the first connecting member, a sidewall of the first portion of the second connecting member, and a sidewall of the second portion of the second connecting member facing the sidewall of the second portion of the first connecting member.

12. The electronic device of claim 11, wherein the sidewall of the first portion of the second connecting member extends between the sidewall of the second portion of the first connecting member and the sidewall of the second portion of the second connecting member.

13. The electronic device of claim 1, comprising a protective cover connected to the second connecting member.

14. The electronic device of claim 13, wherein the protective cover comprises a flange disposed within the gap.

15. The electronic device of claim 13, wherein the second connecting member is between the protective cover and the exterior surface of the peripheral portion.

16. The electronic device of claim 1, wherein the direction that the longest dimension of the second portion of the first connecting member and the longest dimension of the second portion of the second connecting member extend is parallel to an axial direction of the pivot structure.

17. The electronic device of claim 1, wherein the first connecting member comprises a main connecting portion, a secondary connecting portion, and a support arm connected between the main connecting portion and the secondary connecting portion, and the second portion of the first connecting member comprises the secondary connecting portion.

* * * * *